United States Patent
Tang et al.

(10) Patent No.: US 8,942,961 B2
(45) Date of Patent: Jan. 27, 2015

(54) RE-MATCHING METHOD OF SLAB-ORDER FOR IMPROVING SLAB UTILIZATION IN IRON AND STEEL PLANTS

(71) Applicant: Northeastern University, Shenyang (CN)

(72) Inventors: Lixin Tang, Shenyang (CN); Ying Meng, Shenyang (CN)

(73) Assignee: Northeastern University, Shenyang (CN)

( * ) Notice: Subject to any disclaimer, the term of this patent is extended or adjusted under 35 U.S.C. 154(b) by 0 days.

(21) Appl. No.: 13/857,480

(22) Filed: Apr. 5, 2013

(65) Prior Publication Data

US 2013/0268249 A1    Oct. 10, 2013

(30) Foreign Application Priority Data

Apr. 5, 2012    (CN) .......................... 2012 1 0101494

(51) Int. Cl.
G06F 7/60 (2006.01)
G06F 17/10 (2006.01)
G06F 17/50 (2006.01)

(52) U.S. Cl.
CPC ..................................... *G06F 17/50* (2013.01)
USPC ........................................................... 703/2

(58) Field of Classification Search
None
See application file for complete search history.

(56) References Cited

PUBLICATIONS

Tang et al. "A predictive reactive scheduling method for color-coating production in steel industry", Int J Adv Manuf Technol (2008) 35:633-645.*
Yagiura et al. "A very large-scale neighborhood search algorithm for the multi-resource generalized assignment problem", Discrete Optimization 1 (2004) 87-98.*

* cited by examiner

*Primary Examiner* — Omar Fernandez Rivas
*Assistant Examiner* — Bernard E Cothran

(57) ABSTRACT

A re-matching method of slab-order for improving slab utilization in iron and steel plants, comprising the steps of Step 1: formulating a mathematical model according to information of slabs and orders, so as to quantitatively describe the optimization problem of slab-order matching; Step 2: dividing the slabs and orders into groups; Step 3: generating a new slab-order matching relationship for each group of slabs and orders by using a multiple neighborhoods based tabu search algorithm on the basis of the formulated mathematical model, tries to re-optimize the matching relationship with consideration of the original slab-order matching relationship and the load balance of all equipment units, so as to improve the slab-order matching relationship, decrease the slab cutting loss, reduce the redundant slab weight of each order, and improve the integrity of an order, thus improving slab utilization, ensuring to deliver an urgent order on time, and improving the customer satisfaction.

6 Claims, 4 Drawing Sheets

RE-MATCHING METHOD OF SLAB-ORDER FOR IMPROVING SLAB UTILIZATION IN IRON AND STEEL PLANTS

FIELD OF THE INVENTION

The present invention relates to the slab matching aspect of iron and steel plants, which belongs to the field of automation technology, and more specifically, to a re-matching method of slab-order for improving slab utilization in iron and steel plants.

BACKGROUND

Generally, an iron and steel plant produces slabs according to the customer requirements on steel products, such as specification, steel grade, chemical composition, hardness and so on. During the steel production process, first of all, a production schedule is made for steelmaking and continuous casting according to the production order. After slabs are produced, they are subjected to further treatments such as hot-rolling, cold-rolling and so on according to the customer requirements on the products. Finally, finished products are produced to be delivered to the customers. However, the following several reasons cause a low slab utilization, leading to a lot of irrational slab-order matching relationships: 1) In the current iron and steel market, orders tend to require a large variety and a small volume production, which is contradictory to batch production mode of iron and steel industry, for example, a converter or an electric furnace can handle 300 or 250 tons of molten steel in a batch, such that the amount of slabs in accordance with the order may be more than that required by the order; 2) when allocating the open-order slabs to orders, the matching relationship between the open-order slabs and the orders may be sub-optimal due to lack of working experiences and complete information; 3) the generation of unqualified products in post operations may cause that the amount of the products remaining for the order, to which the unqualified products belong, is less than that required by the order. Then, some more slabs need to be allocated to this order.

In prior literatures, most of the domestic and foreign studies on the slab matching problem aim at open-order slabs, which is about the matching of the surplus inventory, while the present invention tries to re-optimize the matching relationship in consideration of the original slab-order matching relationship and the load balance of all equipment units, so as to improve the slab-order matching relationship, decrease the slab cutting loss, reduce the redundant slabs weight of each order, and improve the integrity of an order, thus improving slab utilization, ensuring to deliver an urgent order on time, and improving the customer satisfaction.

SUMMARY

Considering the facts that an iron and steel plant frequently experienced order tardiness, and often had huge slab cutting loss and high redundant slab weights of orders, which are caused by an irrational slab-order matching, the present invention provides a re-matching method of slab-order for improving slab utilization so as to maximize resource utilization, improve customer satisfaction and maximize enterprise profits.

The re-matching method of slab-order for improving slab utilization in iron and steel plants according to the present invention is characterized in that, first, a mathematical model is formulated according to the information of slabs and orders, and then the re-matching problem of slab-order is quantitatively described; second, the slabs and orders are divided into groups; finally, based on the formulated mathematical model, a new slab-order matching relationship is generated for each group of slabs and orders by using a multiple neighborhoods based tabu search algorithm. Meanwhile, an optimization based system of slab-order re-matching is developed according to the re-matching method of slab-order by using visual programming technology.

According to the present invention as described above, a slab-order matching relationship is re-optimized by considering the original slab-order matching relationship and the load balance of all equipment units, so as to improve the quality of the slab matching, decrease the slab cutting loss, reduce the redundant slab weight of each order, and improve the integrity of an order, thus improving slab utilization, ensuring to deliver an urgent order on time, and improving customer satisfaction degree.

DETAILED DESCRIPTION

To make the purpose, the technical solution and the advantages of the present invention clearer, the present invention will be further described in details with reference to the accompanying drawings. It is obvious that the described embodiments are only a part of the embodiments of the present invention rather than all the embodiments. All other embodiments obtained by persons of ordinary skill in the art based on the embodiments of the present invention without creative effects shall fall within the protection scope of the present invention. Thus, the accompanying drawings and the description are essentially illustrative, and are not intended to limit the protection scope of the claims.

In the present invention, an optimization based system of slab-order re-matching is developed by using visual programming techniques on the basis of the re-matching method of slab-order. The functional modules of the system comprise: an authorized user login module, a data downloading module, a data management module, a static parameter management module, an automatic optimization module for generating a matching result, a display and assessment module, a modification module for adjusting the matching result (manual matching result), a matching result uploading module and a system configuration module and so on.

Figure 1:
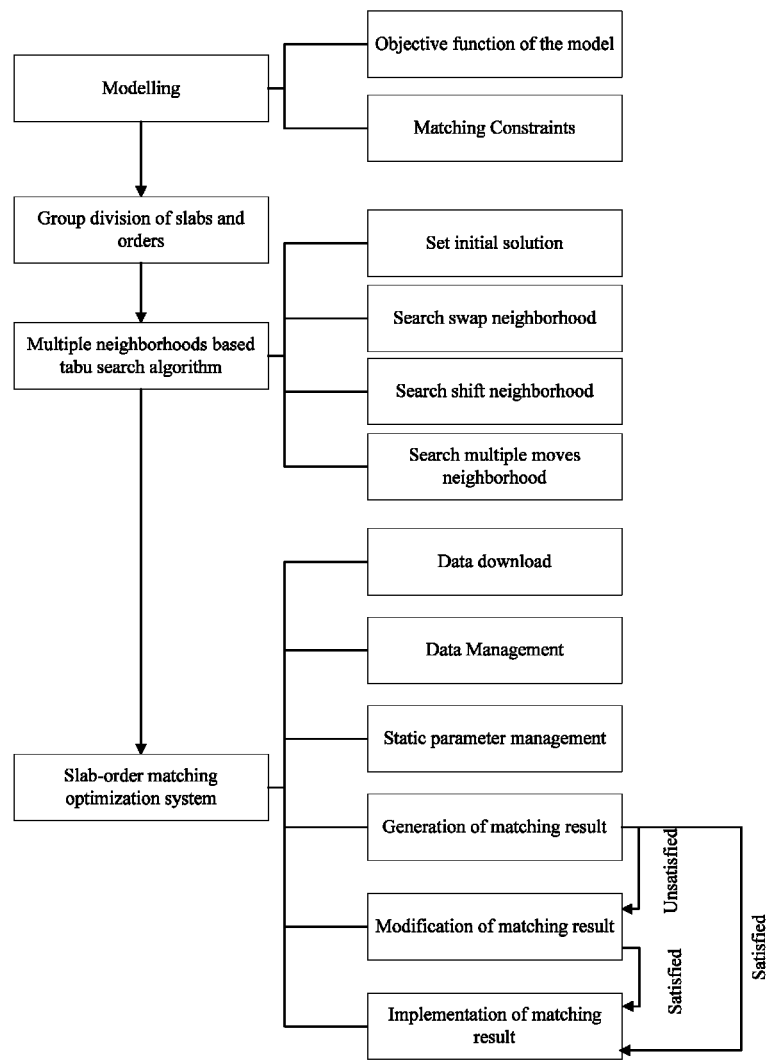
FIG. 1 is a flowchart according to the present invention.

FIG. 1 is a flowchart according to the present invention, showing steps of implementing the re-matching method of slab-order for improving slab utilization in iron and steel plants.

Figure 2:
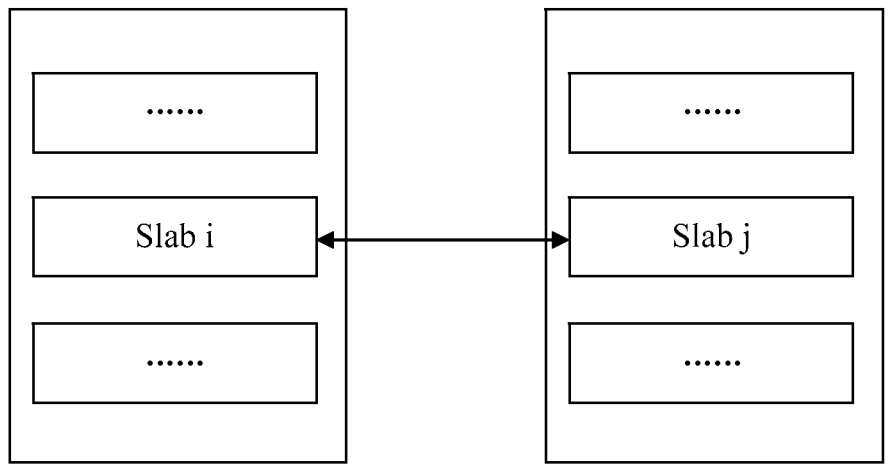
FIG. 2 is a schematic diagram showing the matching relationship before operating a swap of neighborhoods according to the present invention.
Figure 3:
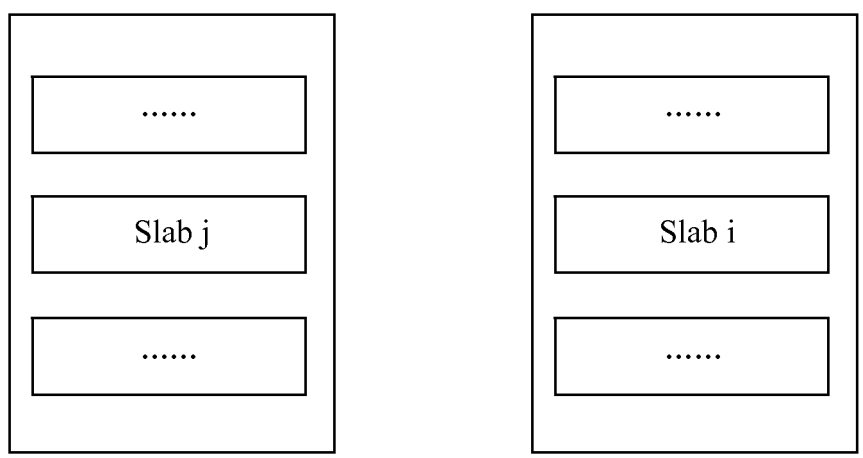
FIG. 3 is a schematic diagram showing the matching relationship after operating a swap of neighborhoods according to the present invention.

FIG. 2 and FIG. 3 are schematic diagrams, showing the matching relationship before and after operating a swap of neighborhoods, respectively, in the multiple neighborhoods based tabu search algorithm according to the present invention. The swap operation shown in the figures denotes a swap of two slabs which has been assigned to different orders, for example, if slab i and slab j are originally assigned to order I and order J, respectively, then after the swap operation is performed, slab i is assigned to order J, and slab j is assigned to order I.

Figure 4:
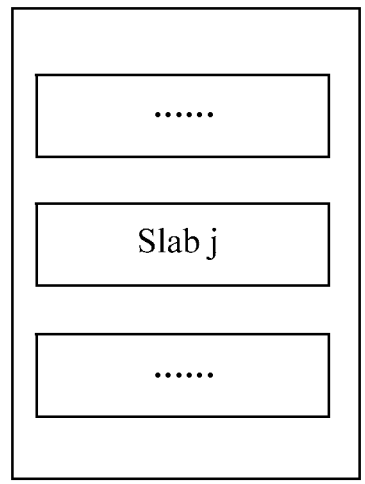
FIG. 4 is a schematic diagram showing the matching relationship before operating a shift of neighborhoods according to the present invention.
Figure 5:
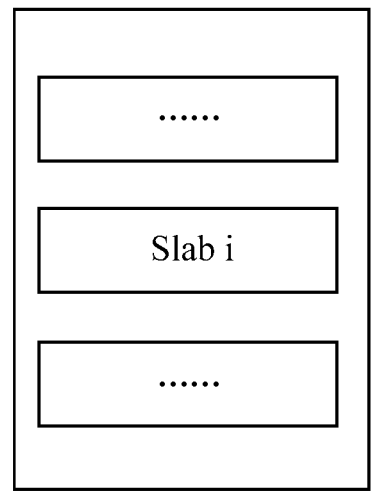
FIG. 5 is a schematic diagram showing the matching relationship after operating a shift of neighborhoods according to the present invention.

FIG. 4 and FIG. 5 are schematic diagrams, showing the matching relationship before and after operating a shift of neighborhoods, respectively, in the multiple neighborhoods based tabu search algorithm according to the present invention. The shift operation shown in the figures denotes a shift of a slab, for example, if slab i is originally assigned to order I, then after the shift operation is performed, slab i is assigned to order J ($J \neq I$).

Figure 6:
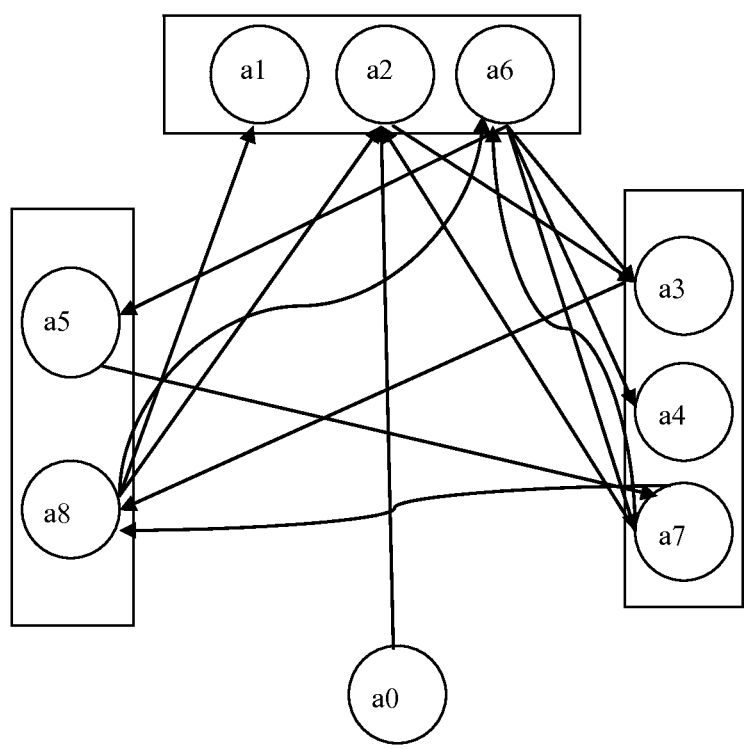
FIG. 6 is an auxiliary network used in the description of the present invention.

FIG. 6 is an auxiliary diagram constructed in the multiple neighborhoods based tabu search algorithm and used for further improving the current matching scheme according to the present invention.

As shown in above figures, the present invention is related to a re-matching method of slab-order for improving slab utilization in iron and steel plants, comprising the steps of Step 1: formulating a mathematical model according to the information of slabs and orders, so as to quantitatively describe the re-matching problem of slab-order; Step 2: dividing the slabs and orders into groups; and Step 3: generating a new slab-order matching relationship for each group of slabs and orders by using a multiple neighborhoods based tabu search algorithm on the basis of the formulated mathematical model.

Preferably, in Step 1, the performance measures for evaluating the matching relationship between slabs and orders are converted into an objective function. By constructing the objectives and expressing matching constraints, a mathematical model for the re-matching problem is formulated and described as follows:

$$\text{Min} \sum_{j=1}^{M} \sum_{i=1}^{N} (c1_{ij} + c2_{ij}) x_{ij} + u_1 \max\left(0, \sum_{i=1}^{N} a_i x_{ij} - A_j^{max}\right) +$$

$$u_2 \min\left\{\max\left(0, A_j^{min} - \sum_{i=1}^{N} a_i x_{ij}\right), UW\right\} - \sum_{j=1}^{M} \sum_{i=1}^{N} R_j x_{ij} +$$

$$\sum_{j=1}^{M} P_j v\left(A_j - AL_j - \sum_{i=1}^{N} a_i x_{ij}\right) + \sum_{j \in H_k} \max\left\{\sum_{i=1}^{N} a_i x_{ij} - T_k, 0\right\}.$$

In addition, the above objectives of the model are:
(1) minimizing the number of slabs which are of high steel grade and assigned to the orders requiring lower steel grade, which is presented by $$\text{Min} \sum_{j=1}^{M} \sum_{i=1}^{N} c1_{ij} x_{ij},$$

wherein, M denotes the set of all the assignable orders, N denotes the set of all the assignable slabs, $c1_{ij}$ denotes the cost caused by the steel grade difference when an assignable slab i is assigned to an assignable order j;

(2) minimizing the slab cutting loss, which is presented by $$\text{Min} \sum_{j=1}^{M} \sum_{i=1}^{N} c2_{ij} x_{ij},$$

wherein, $c2_{ij}$ denotes the cutting loss cost caused by the specification differences in weight, width and length when slab i is assigned to order j;

(3) minimizing the amount of the redundant slab weight of an order, which is presented by $$\text{Min} u_1 \max\left(0, \sum_{i=1}^{N} a_i x_{ij} - A_j^{max}\right),$$

wherein, $u_1$ denotes the penalty cost caused by the redundant slab weight of the order, $a_i$ denotes the weight of slab i, $A_j^{max}$ denotes the upper limit of the required slab weight of order j;

(4) minimizing under-fulfilled slab weights of orders, which is presented by $$\text{Min} u_2 \min\left\{\max\left(0, A_j^{min} - \sum_{i=1}^{N} a_i x_{ij}\right), UW\right\},$$

wherein, $u_2$ denotes the penalty cost caused by the under-fulfilled slab weight of the order, $A_j^{min}$ denotes the lower limit of the required slab weight of order j, UW denotes the maximum value of penalty cost caused by the under-fulfilled slab weight;

(5) maximizing the awards to on time delivery, which is presented by $$\text{Max} \sum_{j=1}^{M} \sum_{i=1}^{N} R_j x_{ij},$$

wherein, $R_j$ denotes the priority awards related to the due date of order j, the order with a tighter due date should be given a higher priority;

(6) minimizing the number of the unfulfilled orders, which is presented by $$\text{Min} \sum_{j=1}^{M} P_j v\left(A_j - AL_j - \sum_{i=1}^{N} a_i x_{ij}\right),$$

wherein, $P_j$ denotes the penalty for the unfulfilled order j, $A_j$ denotes the required slab weight of order j, $AL_j$ denotes the maximal under-fulfilled slab weight of order j, function v(x) denotes that v(x)=1 when x>0, and v(x)=0 when x<0;

(7) minimizing the penalties for the slab weight beyond the guided upper limits of all equipment units subsequent to hot rolling, which is presented by $$\text{Min} \sum_{j \in H_k} \max\left\{\sum_{i=1}^{N} a_i x_{ij} - T_k, 0\right\},$$

wherein, $H_k$ denotes the set of the orders involving the equipment units K, $T_k$ denotes the maximal capacity of the equipment units K.

In addition, the matching constraints of the model refer to:
(1) specification matching constraint, which is presented by $$x_{ij} \leq M_{ij} \ i=1,2,\ldots,N \ j=1,2,\ldots,M$$

(2) matching mode constraint, which is presented by $$\sum_{j \in J} x_{ij} = 1, \ i = 1, \ldots, N$$

(3) the constraint on the amount of redundant slab weight of an order, which is presented by $$\sum_{i=1}^{N} a_i x_{ij} + (A_j^T - A_j) \leq A_j^{min} + \min_{i \in I}\{a_i \mid x_{ij} = 1\} + L \cdot \min_{i \in I}\{1 - x_{ij} \mid j \neq O_{(i)}\}$$

$$j = 1, 2, \ldots, M$$

(4) the constraint on slab weight balance of equipment units, which is presented by $$\sum_{j \in H_k} \sum_{i=1}^{N} a_i x_{ij} \geq B_k \quad k = 1, \ldots, K$$

(5) the constraint on the ranges of decision variables, which is presented by $$x_{ij} \in \{0,1\} \ i=1,2,\ldots,N \ j=1,2,\ldots,M$$

In addition, in Step 3, slabs and orders are divided into groups according to their steel grades, the steel grade and required steel grade of the slabs and orders in the same group are compatible, there is no matching relationship between a slab and an order in different groups, meanwhile, the constraint on slab weight balance of equipment units is approximated as follows:

$$\sum_{j \in H_{kg}} \sum_{i=1}^{N} a_i x_{ij} \geq B_{kg} \quad g = 1, \ldots G, k = 1, \ldots, K$$

$$\sum_{g=1}^{K} B_{kg} = B_k \quad k = 1, \ldots, K$$

wherein, G denotes the number of the slab-order groups after dividing the slabs and orders into groups according to their steel grades, $B_{kg}$ denotes the lower limit of the total slab weight of slabs in group g to be processed by the equipment units K.

Furthermore, in Step 3 of the re-matching method for slab-order, the multiple neighborhoods based tabu search algorithm is a metaheuristic algorithm, the iteration steps of the multiple neighborhoods based tabu search algorithm comprise:

(1) setting the initial solution based on the initial slab and order relationship;
(2) performing local search by searching the swap neighborhood, which is a swap of two slabs assigned to different orders, then selecting the swap operation which has not been recorded in the tabu list and makes the solution have minimum objective value, then setting the solution after performing the selected swap operation as the current solution, finally, recording the selected swap operation in the tabu list, and updating the tabu list.
(3) performing local search by searching the shift neighborhood, which is a shift of a slab, then selecting the shift operation which has not been recorded in the tabu list and makes the solution have minimum objective value, setting the solution after performing the selected shift operation as the current solution, then recording the selected swap operation in the tabu list, and updating the tabu list
(4) based on the current solution, constructing the auxiliary network, and then finding the path with minimum length in the auxiliary network, wherein the path corresponds to a series of moves that can make the solution have minimum objective value, setting the solution after performing this series of moves as the current solution, finally, repeating the search procedure until the objective value of the current solution cannot be reduced.

In the auxiliary network, the node set V consists of a dummy starting slab $a_0$, N slabs to be re-matched and M dummy slabs for M orders; and an arc $(a_l, a_k)$ is connected between $a_l$, and $a_k$, if slab $a_l$ could be re-matched to order $O(a_k)$ after $a_k$ is removed from its order.

A specific mode for carrying out the present invention is described as follows.

The implementation of the software system according to the present invention will require the following devices: at least one PC, at least one cable interface or optical cable interface, and at least one router. These devices constitute a small scale LAN and the LAN is connected to an enterprise ERP system. In the PC, the database system Microsoft SQL Sever 2000 and a software system provided according to the present invention are installed. The server address, the server ports, the name of the database, and users' names and passwords are configured for the system. When system installation is done, the following operation steps may be performed to obtain the slab-order matching results.

Step 1: after starting up the matching system, the user inputs user's name and password, if the user is unauthorized, he or she will not be able to enter the matching system; if the user is authorized, he or she will be able to enter the matching system.

Step 2: The user enters the data downloading interface of the matching system, and downloads the slab information and the order information. The downloaded slab information includes following fields: slab number, order number, cutting time, slab thickness, slab length, slab width, slab tail width, slab head width, slab weight, flow of slab, slab status, stock position, error code, material group, steel grade, transfer plan number, cutting plan number, slab composition, outsourcing mark. The order information includes: order number, BACKLOG number, steel grade, order status, nature of order, required slab weight of order, upper limit of order tolerance, lower limit of order tolerance, maximum weight of the finished product, minimum weight of the finished product, in-plant due date, customer's due date, rolling thickness, unfulfilled weight at application process, unfulfilled weight at hot rolling process, upper limit of slab width, lower limit of slab width, upper limit of slab length, lower limit of slab length, upper limit of slab weight, lower limit of slab weight, material group, flow of hot rolled steel coil, batch code, width of the finished plate/coil, inventory at the steelmaking process, inventory at the hot rolling process, hot rolling feeding coefficient, composition list required by order, outsourcing mark. The data mentioned above are automatically generated by the enterprise ERP system and stored in text form in a specific FTP server. When a download command is performed, the data files stored in text form is downloaded into the local computer by using a FTP command, then, the information of the text file is read into a data list of the SQL Server 2000 database by using SQL sentences. The downloaded slab information and order information may be displayed in the data downloading interface.

Step 3: When the data are downloaded, the user inputs a model and algorithm-related parameters in the computation interface, and then calls the re-matching method of slab-order according to the present invention, so that a slab-order matching result can be generated automatically.

Step 4: The user performs checks on the matching result automatically generated by the system. If the user is not satisfied with the results, then he/she may call the modification module for adjusting the results by using a graphic editor. If the user is satisfied with the results, then he/she calls the upload module and then the matching result is uploaded into the enterprise ERP system. The matching results uploaded into the enterprise ERP system is also stored in a text file form in a prescribed directory in the local computer, which will then be uploaded under a prescribed file name to a prescribed directory in a FTP server prescribed by the enterprise ERP system by using FTP commands, and further uploaded from the FTP server to the enterprise ERP system.

Step 5: The enterprise ERP system take the corresponding data from the related data list according to the obtained matching results to form a standard matching scheme for the enterprise ERP system, so as to prepare for the production plan.

A practical production data of 20 days' continuous production in an iron and steel plant is shown in Table 1, in which the number of slabs and the number of orders are included.

TABLE 1

| Series No. | Number of Slabs | Number of Orders |
| --- | --- | --- |
| 1 | 931 | 3865 |
| 2 | 799 | 3460 |
| 3 | 932 | 3367 |
| 4 | 994 | 3407 |
| 5 | 977 | 3438 |
| 6 | 613 | 3384 |
| 7 | 1016 | 3253 |
| 8 | 1039 | 3240 |
| 9 | 706 | 3191 |
| 10 | 1017 | 3190 |
| 11 | 990 | 3010 |
| 12 | 895 | 3294 |
| 13 | 1118 | 3524 |
| 14 | 1098 | 4001 |
| 15 | 1188 | 4057 |
| 16 | 1277 | 4158 |
| 17 | 1053 | 4185 |
| 18 | 926 | 4192 |
| 19 | 885 | 3705 |
| 20 | 980 | 3296 |
| Average | 971.7 | 3560.85 |

The 20 groups of data are applied to test the re-matching method of slab-order according to the present invention, and the obtained matching results are compared with the original matching relationship. The comparison results are shown in Table 2.

TABLE 2

| Series No. | Number of Slabs | Number of Orders | Reduction of cutting loss | Amount reduction of cut slabs | Increment of fulfilled orders | Increment of fulfilled urgent orders | Reduction of redundant slab weight | Running time |
| --- | --- | --- | --- | --- | --- | --- | --- | --- |
| 1 | 931 | 3865 | 50.8422 | 34 | 51 | 11 | 1139.64 | 75.859 |
| 2 | 799 | 3460 | 49.1609 | 32 | 17 | 6 | 690.185 | 47.5 |
| 3 | 932 | 3367 | 74.8242 | 24 | 34 | 8 | 871.998 | 50.062 |
| 4 | 994 | 3407 | 80.6844 | 33 | 49 | 4 | 969.133 | 81.937 |
| 5 | 977 | 3438 | 69.3468 | 34 | 43 | 3 | 669.327 | 81.39 |
| 6 | 613 | 3384 | 37.3803 | 4 | 26 | 3 | 273.338 | 39.343 |
| 7 | 1016 | 3253 | 62.6002 | 25 | 36 | 9 | 746.239 | 49.547 |
| 8 | 1039 | 3240 | 53.4547 | 28 | 44 | 5 | 720.777 | 63.563 |
| 9 | 706 | 3191 | 43.1078 | 8 | 28 | 7 | 193.377 | 70.391 |
| 10 | 1017 | 3190 | 48.6699 | 14 | 35 | 10 | 375.008 | 75.546 |
| 11 | 990 | 3010 | 32.1054 | 29 | 48 | 11 | 682.242 | 41.938 |
| 12 | 895 | 3294 | 30.5829 | 7 | 40 | 5 | 433.359 | 39.594 |
| 13 | 1118 | 3524 | 29.7869 | 15 | 48 | 9 | 830.23 | 88.937 |
| 14 | 1098 | 4001 | 41.449 | 19 | 49 | 9 | 788.511 | 74.531 |
| 15 | 1188 | 4057 | 35.3601 | 30 | 29 | 12 | 942.399 | 80.656 |
| 16 | 1277 | 4158 | 53.4335 | 37 | 25 | 22 | 1045.52 | 118.11 |
| 17 | 1053 | 4185 | 34.0847 | 27 | 21 | 10 | 594.202 | 82.484 |
| 18 | 926 | 4192 | 29.2232 | 17 | 33 | 5 | 849.914 | 78.516 |
| 19 | 885 | 3705 | 21.5024 | 16 | 25 | 8 | 738.322 | 99.578 |
| 20 | 980 | 3296 | 32.8253 | 31 | 42 | 10 | 781.209 | 66.609 |
| Ave. | 971.7 | 3560.85 | 45.52124 | 23.2 | 36.15 | 8.35 | 716.7465 | 70.30455 |

According to the above results, in comparison with the original matching relationship, the matching relationship obtained by using the re-matching method of slab-order according to the present invention realizes an average reduction of 28.57% in cutting loss, a reduction of 9.71% in amount of cut slabs, an increment of 6.81% in fulfilled orders, an increment of 9.20% in urgent fulfilled orders, a reduction of 25.28% in over-required slab weight, a reduction of 32.36% in redundant slab weight. Therefore, it is confirmed that the present method is far superior to the original matching method, and can effectively improve slab utilization, decrease waste of resources, ensure on time delivery of orders, and thus improve customer satisfaction.

What is claimed is:

1. A re-matching method of slab-order for improving slab utilization in iron and steel plants, characterized in that it comprises the steps of:

Step 1: formulating a mathematical model according to information of slabs and orders, so as to quantitatively describe a re-matching problem of slab-order;

Step 2: dividing the slabs and orders into groups; and

Step 3: generating a new slab-order matching relationship for each group of slabs and orders by using multiple neighborhoods based tabu search algorithm on the basis of the formulated mathematical model, wherein, in Step 1, the performance measures for evaluating the matching relationship between slabs and orders are converted into an objective function, and by constructing objectives and expressing matching constraints, a mathematical model for the re-matching problem is formulated and described as follows:

$$\text{Min} \sum_{j=1}^{M} \sum_{i=1}^{N} (c1_{ij} + c2_{ij}) + u_1 \max\left(0, \sum_{i=1}^{N} a_i x_{ij} - A_j^{max}\right) +$$

-continued $$u_2 \min\left\{\max\left(0, A_j^{min} - \sum_{i=1}^{N} a_i x_{ij}\right), UW\right\} - \sum_{j=1}^{M} \sum_{i=1}^{N} R_j x_{ij} +$$

$$\sum_{j=1}^{M} P_j v\left(A_j - AL_j - \sum_{i=1}^{N} a_i x_{ij}\right) + \sum_{j \in H_k} \max\left(\sum_{i=1}^{N} a_i x_{ij} - T_k, 0\right)$$

wherein, M denotes set of all assignable orders, N denotes set of all assignable slabs, $c1_{ij}$ denotes cost caused by steel grade difference when an assignable slab i is assigned to an assignable order j;

wherein $c2_{ij}$ denotes cutting loss cost caused by specification differences in weight, width and length when slab i is assigned to order j;

wherein, $u_1$ denotes penalty cost caused by the redundant slab weight of the order, $a_i$ denotes weight of slab i $A_j^{max}$: denotes an upper limit of a required slab weight of order j;

wherein, $u_2$ denotes the penalty cost caused by the under-fulfilled slab weight of $A_j^{min}$ the order, denotes a lower limit of the required slab weight of order j, UW denotes a maximum value of penalty cost caused by the under-fulfilled slab weight;

wherein, $R_j$ denotes priority awards related to a due date of order j, the order with a tighter due date should be given a higher priority;

wherein, Pj denotes the penalty for the unfulfilled order j, $A_j$ denotes the required slab weight of order j, $AL_j$ denotes a maximal under-fulfilled slab weight of order j, function v(x) denotes that v(x)=1 when x>0, and v(x)=0 when x<0;

wherein, $H_k$ denotes a set of the-orders involving the equipment units K, $T_k$ denotes a maximal capacity of the equipment units K.

2. The re-matching method of slab-order for improving slab utilization in iron and steel plants according to claim 1, characterized in that the optimization goals of the model are:

(1) minimizing the number of slabs which are of high steel grade and assigned to the orders requiring lower steel grade, which is presented by $$\text{Min} \sum_{j=1}^{M} \sum_{i=1}^{N} c1_{ij} x_{ij},$$

wherein, M denotes set of all assignable orders, N denotes set of all assignable slabs, $c1_{ij}$ denotes cost caused by steel grade difference when an assignable slab i is assigned to an assignable order j;

(2) minimizing slab cutting loss, which is presented by $$\text{Min} \sum_{j=1}^{M} \sum_{i=1}^{N} c2_{ij} x_{ij},$$

wherein, $c2_{ij}$ denotes cutting loss cost caused by specification differences in weight, width and length when slab i is assigned to order j;

(3) minimizing the amount of redundant slab weight of an order, which is presented by $$\text{Min } u_1 \max\left(0, \sum_{i=1}^{N} a_i x_{ij} - A_j^{max}\right),$$

wherein, $u_1$ denotes penalty cost caused by the redundant slab weight of the order, $a_i$ denotes weight of slab i, $A_j^{max}$ denotes an upper limit of a required slab weight of order j;

(4) minimizing under-fulfilled slab weights of orders, which is presented by $$\text{Min } u_2 \min\left\{\max\left(0, A_j^{min} - \sum_{i=1}^{N} a_i x_{ij}\right), UW\right\},$$

wherein, $u_2$ denotes the penalty cost caused by the under-fulfilled slab weight of the order, $A_j^{max}$ denotes a lower limit of the required slab weight of order j, UW denotes a maximum value of penalty cost caused by the under-fulfilled slab weight;

(5) maximizing awards to on time delivery, which is presented by $$\text{Max} \sum_{j=1}^{M} \sum_{i=1}^{N} R_j x_{ij},$$

wherein, $R_j$ denotes priority awards related to a due date of order j, the order with a tighter due date should be given a higher priority;

(6) minimizing the number of unfulfilled orders, which is presented by $$\text{Min} \sum_{j=1}^{M} P_j v\left(A_j - AL_j - \sum_{i=1}^{N} a_i x_{ij}\right),$$

wherein, $P_j$ denotes the penalty for the unfulfilled order j, $A_j$ denotes the required slab weight of order j, $AL_j$ denotes a maximal under-fulfilled slab weight of order j, function v(x) denotes that v(x)=1 when x>0, and v(x)=0 when x<0;

(7) minimizing penalties for slab weight beyond guided upper limits of all equipment units subsequent to hot rolling, which is presented by $$\text{Min} \sum_{j \in H_k} \max\left\{\sum_{i=1}^{N} a_i x_{ij} - T_k, 0\right\},$$

wherein, $H_k$ denotes a set of orders involving the equipment units K, $T_k$ denotes a maximal capacity of the equipment units K.

3. The re-matching method of slab-order for improving slab utilization in iron and steel plants according to claim 1, characterized in that the matching constraints of the model refer to:

(1) specification matching constraint, which is presented by $$x_{ij} \leq M_{ij} \; i=1,2,\ldots,N \, j=1,2,\ldots,M$$

(2) matching mode constraint, which is presented by $$\sum_{j \in J} x_{ij} = 1, \quad i = 1, \ldots, N$$

(4) constraint on slab weight balance of equipment units, which is presented by $$\sum_{j \in H_k} \sum_{i=1}^{N} a_i x_{ij} \geq B_k \quad k = 1, \ldots, K$$

(5) constraint on ranges of decision variables, which is presented by $$x_{ij} \in \{0,1\} \; i=1,2,\ldots,N \, j=1,2,\ldots,M.$$

4. The re-matching method of slab-order for improving slab utilization in iron and steel plants according to claim 1, characterized in that in Step 3, slabs and orders are divided into groups according to their steel grades, the steel grade and required steel grade of the slabs and orders in the same group are compatible, there is no matching relationship between a slab and an order in different groups, meanwhile, the constraint on slab weight balance of equipment units is approximated as follows:

$$\sum_{j \in H_{kg}} \sum_{i=1}^{N} a_i x_{ij} \geq B_{kg} \quad g = 1, \ldots G, k = 1, \ldots, K$$

$$\sum_{g=1}^{K} B_{kg} = B_k \quad k = 1, \ldots, K$$

wherein, G denotes the number of slab-order groups after dividing the slabs and orders into groups according to their steel grades, $B_{kg}$ denotes a lower limit of a total slab weight of slabs in group g to be processed by the equipment units K, $a_i$ denotes weight of slab i.

5. The re-matching method of slab-order for improving slab utilization in iron and steel plants according to claim 1, characterized in that in Step 3, the multiple neighborhoods based tabu search algorithm is a metaheuristic algorithm, iteration steps of the multiple neighborhoods based tabu search algorithm comprise:
(1) setting an initial solution based on an initial slab and order relationship;
(2) performing local search by searching swap neighborhood, which is a swap of two slabs assigned to different orders, then selecting swap operation which has not been recorded in a tabu list and makes the solution have minimum objective value, then setting the solution after performing a selected swap operation as a current solution, finally, recording the selected swap operation in the tabu list, and updating the tabu list;
(3) performing local search by searching shift neighborhood, which is a shift of a slab, then selecting a shift operation which has not been recorded in the tabu list and makes the solution have minimum objective value, setting the solution after performing the selected shift operation as the current solution, then recording the selected swap operation in the tabu list, and updating the tabu list;
(4) based on the current solution, constructing an auxiliary network, and then finding a path with minimum length in the auxiliary network, wherein the path corresponds to a series of moves that can make the solution have minimum objective value, setting the solution after performing this series of moves as the current solution, finally, repeating the search procedure until the objective value of the current solution cannot be reduced.

6. The re-matching method of slab-order for improving slab utilization in iron and steel plants according to claim 5, characterized in that in Step 3, in the auxiliary network, the node set V consists of a dummy starting slab $a_0$, N slabs to be re-matched and M dummy slabs for M orders; and an arc $(a_l, a_k)$ is connected between $a_l$ and $a_k$, if slab $a_l$ could be re-matched to order $O(a_k)$ after $a_k$ is removed from its order.

* * * * *